(12) United States Patent
Dachs

(10) Patent No.: US 9,623,527 B2
(45) Date of Patent: Apr. 18, 2017

(54) COMPONENT CARRIER ASSEMBLY HAVING A TRENCH STRUCTURE WHICH SEPARATES COMPONENT CARRIER REGIONS, AND METHOD FOR PRODUCING A PLURALITY OF COMPONENT CARRIER REGIONS

(75) Inventor: Jürgen Dachs, Baar-Ebenhausen (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 146 days.

(21) Appl. No.: 14/115,854

(22) PCT Filed: May 6, 2011

(86) PCT No.: PCT/EP2011/057334
§ 371 (c)(1),
(2), (4) Date: Feb. 5, 2014

(87) PCT Pub. No.: WO2012/152307
PCT Pub. Date: Nov. 15, 2012

(65) Prior Publication Data
US 2014/0145391 A1    May 29, 2014

(51) Int. Cl.
*B23Q 3/00*     (2006.01)
*H01L 21/306*   (2006.01)
(Continued)

(52) U.S. Cl.
CPC .......... *B23Q 3/00* (2013.01); *H01L 21/30604* (2013.01); *H01L 21/6835* (2013.01);
(Continued)

(58) Field of Classification Search
CPC . H01L 21/00; H01L 2222/00; H01L 2223/00; H01L 2924/00; H01L 2925/00;
(Continued)

(56) References Cited

U.S. PATENT DOCUMENTS 4,990,462 A * 2/1991 Sliwa, Jr. ............... H01L 23/52
                                             148/DIG. 28
5,578,866 A   11/1996 DePoorter et al.
(Continued)

FOREIGN PATENT DOCUMENTS

CN      101994925 A    3/2011
EP        1749794 A2   2/2007
(Continued)

OTHER PUBLICATIONS

Williams, M.E. Baldwin, D.G.. (1995). Semiconductor Industrial Hygiene Handbook—Monitoring, Ventilation, Equipment and Ergonomics—A.4.6 Wafer Etching. William Andrew Publishing/Noyes. Online version available at: http://app.knovel.com/hotlink/pdf/id:kt0064ELF5/semiconductor-industrial/wafer-etching.*

Primary Examiner — Larry E Waggle, Jr.
Assistant Examiner — Mahdi H Nejad
(74) Attorney, Agent, or Firm — McDermott Will & Emery LLP

(57) ABSTRACT

A component carrier assembly (1) is provided which has a plurality of component carrier regions (10), which are intended for mounting semiconductor components. The component carrier assembly comprises a carrier body (2) with a first major face (21). On the first major face a trench pattern (3) is formed in the carrier body, with first trenches (31) extending parallel to one another in a first direction, the first trenches delimiting the component carrier regions in a second direction extending transversely of the trenches. A coating (4) is formed on the carrier body, such that the component carrier regions each have a first major face of the carrier body which is coated at least in places and a side face (5) of the trench pattern which is coated at least in places.

12 Claims, 6 Drawing Sheets

(51) Int. Cl.
*H01L 21/683* (2006.01)
*H01L 23/00* (2006.01)
*H01L 21/78* (2006.01)
*H01L 21/66* (2006.01)
*H01L 33/48* (2010.01)

(52) U.S. Cl.
CPC .......... *H01L 21/6836* (2013.01); *H01L 24/97* (2013.01); *H01L 21/78* (2013.01); *H01L 22/10* (2013.01); *H01L 33/486* (2013.01); *H01L 2221/68331* (2013.01); *H01L 2224/83192* (2013.01); *H01L 2924/00* (2013.01); *H01L 2924/00014* (2013.01); *H01L 2924/01005* (2013.01); *H01L 2924/01013* (2013.01); *H01L 2924/01029* (2013.01); *H01L 2924/01032* (2013.01); *H01L 2924/01047* (2013.01); *H01L 2924/01049* (2013.01); *H01L 2924/01074* (2013.01); *H01L 2924/01078* (2013.01); *H01L 2924/01079* (2013.01); *H01L 2924/12041* (2013.01); *H01L 2924/12042* (2013.01); *H01L 2924/14* (2013.01); *H01L 2924/15786* (2013.01)

(58) Field of Classification Search
CPC ..... H01L 21/30604; H01L 2924/00014; H01L 2924/12042; H01L 2924/14; H01L 21/78; H01L 2924/01078; H01L 2924/12041; G02F 2201/00; G02F 1/00; G02F 2202/00; G02F 2413/00; B23Q 3/00
USPC .......... 269/287; 438/700, 113; 257/E21.599, 257/620; 156/345.51
See application file for complete search history.

(56) References Cited

U.S. PATENT DOCUMENTS

| | | | | |
|---|---|---|---|---|
| 6,048,434 | A * | 4/2000 | Tamura | H01L 21/67109 118/500 |
| 6,234,440 | B1 * | 5/2001 | Boney | A47H 7/00 248/354.1 |
| 6,379,999 | B1 * | 4/2002 | Tanabe | H01L 21/78 257/684 |
| 6,491,757 | B2 * | 12/2002 | Halpin | C23C 16/4586 118/666 |
| 6,894,386 | B2 * | 5/2005 | Poo | H01L 21/78 257/620 |
| 7,049,672 | B2 * | 5/2006 | Headley | H01L 21/78 257/103 |
| 7,358,154 | B2 * | 4/2008 | Poo | H01L 21/78 257/E21.484 |
| 7,514,291 | B2 * | 4/2009 | Akram | B28D 1/221 257/E23.001 |
| 7,665,201 | B2 * | 2/2010 | Sjoedin | H01L 21/561 257/620 |
| 7,712,211 | B2 * | 5/2010 | Chia | H01L 21/6835 174/521 |
| 7,972,444 | B2 * | 7/2011 | Zucker | C23C 14/50 118/724 |
| 8,541,262 | B2 * | 9/2013 | Lai | H01L 21/76898 257/774 |
| 2002/0011655 | A1 * | 1/2002 | Nishiyama | H01L 21/561 257/688 |
| 2002/0069820 | A1 * | 6/2002 | Yudovsky | C23C 16/4581 118/500 |
| 2003/0107866 | A1 * | 6/2003 | Lee | H01L 21/6831 361/234 |
| 2003/0132319 | A1 * | 7/2003 | Hytros | C23C 16/45565 239/548 |
| 2003/0141570 | A1 * | 7/2003 | Chen | G01L 9/0054 257/618 |
| 2005/0199489 | A1 * | 9/2005 | Stevens | H01L 21/67126 204/275.1 |
| 2009/0042320 | A1 * | 2/2009 | Wang | H01L 21/6715 438/5 |
| 2011/0021031 | A1 * | 1/2011 | Taylor | C04B 35/593 438/724 |
| 2012/0104445 | A1 * | 5/2012 | Yang | H01L 33/60 257/98 |
| 2012/0181738 | A1 * | 7/2012 | Hirose | C23C 16/4404 269/303 |
| 2016/0042996 | A1 * | 2/2016 | Yakoo | H01L 21/78 438/462 |

FOREIGN PATENT DOCUMENTS

| | | |
|---|---|---|
| JP | H02163955 A | 6/1990 |
| JP | 02244689 A | 9/1990 |
| JP | 04150086 A | 5/1992 |
| JP | H06188525 A | 7/1994 |
| JP | 08330672 A | 12/1996 |
| JP | 2002094123 A | 3/2002 |
| JP | 2006261482 A | 9/2006 |
| JP | 2008034585 A | 2/2008 |

* cited by examiner

COMPONENT CARRIER ASSEMBLY HAVING A TRENCH STRUCTURE WHICH SEPARATES COMPONENT CARRIER REGIONS, AND METHOD FOR PRODUCING A PLURALITY OF COMPONENT CARRIER REGIONS

The present application relates to a component carrier assembly with a plurality of component carrier regions and to a method for producing a plurality of component carrier regions.

Optoelectronic components such as for example optoelectronic semiconductor chips are often mounted on component carriers for further processing.

Such component carriers may for example take the form of ceramic carriers. However, with such component carriers it is difficult to meet stringent precision requirements, for instance with regard to the perpendicularity of the side faces.

One object is to simplify the formation of component carriers which meet stringent precision requirements. Furthermore, it is intended to provide a method which simplifies the production of component carriers.

This object is achieved by the subject matter of the independent claims. Configurations and further developments constitute the subject matter of the dependent claims.

According to one embodiment, a component carrier assembly comprises a plurality of component carrier regions, which are provided for the mounting of preferably optoelectronic semiconductor components. The component carrier assembly comprises a carrier body with a first major face. On the first major face a trench pattern is formed in the carrier body, with first trenches extending preferably parallel to one another in a first direction, the first trenches delimiting the component carrier regions in a second direction extending transversely of the trenches. A coating is formed on the carrier body, such that the component carrier regions each have a first major face of the carrier body which is coated at least in places and a side face of the trench pattern which is coated at least in places.

In a method for producing a plurality of component carrier regions, according to one embodiment a carrier body is provided which has a first major face and a second major face opposite the first major face. A trench pattern is formed in the carrier body in the first major face, wherein the trench pattern comprises first trenches extending in a first direction, which trenches separate from one another at least in places component carrier regions arranged adjacent one another in a second direction extending transversely of the first direction. A coating is formed, which covers the first major face at least in places and a side face of the trench pattern at least in places. The carrier body is thinned at the second major face in such a way that the trench pattern extends completely through the carrier body at least in places in a direction extending obliquely or perpendicularly to the first major face.

The method is particularly suitable for the production of the above-described component carrier assembly. Features described below in connection with the component carrier assembly may therefore also be used for the method and vice versa.

According to one embodiment the trench pattern is formed by means of a chemical, in particular dry chemical, method or by means of erosion. A particularly suitable dry chemical method is deep reactive ion etching (DRIE) or a method based thereon, such as for example advanced silicon etching (ASE). Such methods allow trenches with a large aspect ratio, i.e. trenches which may be very deep compared with their width, to be formed with great accuracy.

At least one side face of each component carrier region is thus already formed on formation of the trench pattern. An angle of the side face may be adjusted very precisely when forming the trench pattern, such that for example trenches with a side face perpendicular to the first major face may be produced very accurately.

The carrier body is preferably based on a semiconductor material. For example, silicon is particularly suitable because of its inexpensive and large-area availability. Another semiconductor material, for example gallium arsenide or germanium, may however also be used.

A semiconductor component mounted on the first major face may be electrically contacted in a simple manner by means of the coating extending over the side face.

In one variant configuration, at least two side faces of the component carrier region are coated at least in places. The coating may also at least in places or completely cover the side faces of the component carrier region on all sides. The carrier body is thus provided with the coating along the entire circumference.

In one preferred configuration, the coating is formed by means of a coating source, wherein a main coating direction of the coating source is oblique to a normal to the first major face. Formation of the coating on at least one side face of the component carrier regions is thus simplified.

During coating the carrier body may be rotated relative to the normal to the first major face. Coating of a plurality or all of the side faces of the component carrier regions is thus simplified.

In a variant embodiment of the component carrier assembly, the first trenches extend over the carrier body only in places in the first direction. In other words, the extent of the carrier body is greater in the first direction than the extent of the first trench in this direction. It is also preferable for the carrier body to be of continuous construction. All the component carrier regions may thus be provided in a common, mechanically stable component carrier assembly.

In one further development, component carrier regions arranged adjacent one another in the second direction are separated from one another in the continuous carrier body by one of the first trenches.

In a further variant configuration, the trench pattern comprises second trenches extending in the second direction, in particular parallel to one another, which delimit the component carrier regions in the first direction. With such a trench pattern it is possible to form two or more, in particular all of the side faces of the carrier body when forming the trench pattern. An additional singulation step for singulating the component carrier assembly into component carrier regions may be dispensed with.

In a preferred further development, the component carrier regions are arranged on a common auxiliary carrier, for example an adhesive film, and separated from one another by means of the trench pattern. The component carrier regions are thus present on the auxiliary carrier in singulated form, for example in a matrix. Population of the component carrier regions with semiconductor components, for example by means of a pick-and-place method, is thus simplified in comparison with component carriers provided as bulk good.

In one configuration of the method, the trench pattern is configured as a grid, such that the carrier body is singulated into mutually separated component carrier regions on thinning. In this case, the component carrier regions thus constitute singulated component carriers, for the production of which no further singulation step is necessary in addition to formation of the trench pattern and thinning.

In a further variant configuration of the method the trench pattern is in strip-form and the carrier body is divided on thinning into a plurality of component carrier strips each with a plurality of component carrier regions. The component carrier regions of a component carrier strip may subsequently be singulated into component carriers in a further singulation step. Singulation may proceed before or after mounting of semiconductor components on the component carriers. A mechanical singulation method is suitable, for example, for instance sawing, cleaving or breaking, or a laser separation method.

In a further variant configuration of the method, the trench pattern is only configured in strip form in places. After complete severing, the component carrier comprises a continuous carrier body, with which a plurality of component carrier regions is formed.

In one preferred configuration, components are mounted on component carrier regions before the component carrier regions are singulated from the component carrier assembly into component carriers.

Population with components may thus proceed while the component carrier assembly is still intact.

In a further preferred configuration, the components are operated prior to singulation. By starting them up, it is for example possible to determine and dispose of components which are not functional or which fail after only very brief operation. The components are preferably connected together electrically in the component carrier assembly in such a way that a plurality of components can be electrically operated simultaneously.

Further features, configurations and convenient aspects are revealed by the following description of the exemplary embodiments in conjunction with the figures, in which.

Identical, similar or identically acting elements are provided with the same reference numerals in the figures.

The figures and the size ratios of the elements illustrated in the figures relative to one another are not to be regarded as being to scale. Rather, individual elements may be illustrated on an exaggeratedly large scale for greater ease of depiction and/or better comprehension.

Figure 1A:
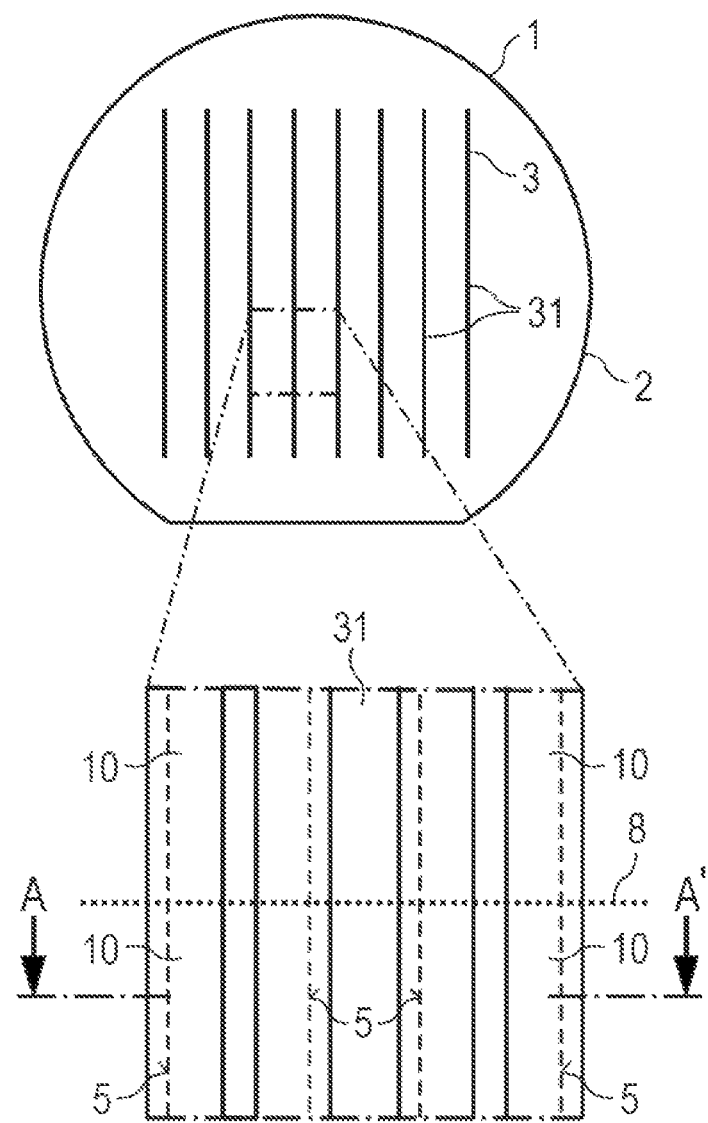
FIGS. 1A and 1B show a first exemplary embodiment of a component carrier assembly in schematic plan view (FIG. 1A) and associated sectional view (FIG. 1B)
Figure 1B:
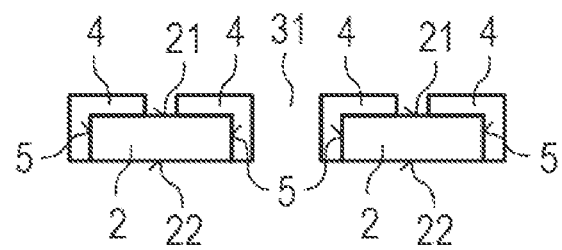

A first exemplary embodiment of a component carrier assembly 1 is shown in schematic plan view in FIG. 1A, with an enlarged portion, and in associated schematic sectional view along line AA' in FIG. 1B. The component carrier assembly comprises a carrier body 2, which may for example take the form of a semiconductor wafer. The carrier body 2 is preferably based on a semiconductor material, in particular silicon. In contrast thereto, it is also possible to use another semiconductor material, for instance gallium arsenide or germanium.

In a vertical direction extending perpendicularly to a main plane of extension of the carrier body 2, the carrier body extends between a first major face 21 and a second major face 22. At the side of the first major face 21 a trench pattern 3 is formed with first trenches 31 extending parallel to one another. The first trenches 31 extend in a first direction. In the vertical direction the first trenches extend right through the carrier body 2. In the first direction the first trenches 31 extend over the carrier body 2 only in places, such that the carrier body 2 is of continuous construction despite the first trenches 31. In other words, the carrier body 2 is of one-piece configuration.

The enlarged representation shows four component carrier regions 10. In a second direction extending perpendicularly to the first direction, two adjacent component carrier regions 10 are separated from one another by a first trench 31. In the second direction a singulation line 8 is shown. Component carrier regions 10 adjacent in the first direction may be singulated along this line. Singulation may proceed for example mechanically, for instance by means of cleaving, breaking or sawing. A laser separation method may also be used. After singulation, each component carrier region thus has two side faces 5 formed by the trench pattern 3 and two side faces in each case perpendicular or at least transverse thereto, which arise only on singulation of the component carrier assembly 1 into component carriers.

The first trenches 31 form side faces 5 which delimit the carrier bodies 2 of the component carrier regions 10 in the second direction. A coating 4 is formed on the carrier bodies 2. The coating 4 extends in places on the first major face 21 and on the second side face 5. The second major face 22 of the carrier body 2 is free of material of the coating 4.

The component carrier regions 10 are each intended for mounting at least one semiconductor component, for example an optoelectronic semiconductor chip, for instance an LED or a laser diode, on the first major face 21. The coating 4 is preferably patterned in such a way that semiconductor components mounted on the component carrier assembly 1 may be jointly electrically contacted.

In the exemplary embodiment shown, the coating 4 extends in strip form in the first direction over a plurality of component carrier regions 10. Semiconductor components mounted on the component carrier assembly may be started up, in particular jointly. It is thus simply possible to determine and dispose of semiconductor components which are not functional, which fail after a comparatively short operating time or which do not display specified electronic or optoelectronic characteristics.

After temporary start-up the component carrier regions 10 may be singulated along the singulation line 8. On singulation, the electrical connection between adjacent component carrier regions is thus broken.

The singulation step produces component carriers from the component carrier assembly on which semiconductor components have already been mounted.

In particular to simplify mounting of the semiconductor components, it is possible to form a further coating (not shown explicitly in FIGS. 1A and 1B), for example a solder layer, on the coating 4.

Configuration of the coating 4 is freely variable within broad limits. In particular, the coating may also be unpatterned and extend over the entire first major face 21 of the carrier body 2. Moreover, the coating 4 may also be configured such that just one side face 5 is covered by the coating 4 at least in places.

The coating may furthermore also be of multilayer construction. At least one layer of the coating 4 preferably contains a metal, for example copper, gold, silver, aluminium, platinum, titanium or tungsten, or a metal alloy with at least one of the stated materials.

Figure 2A:
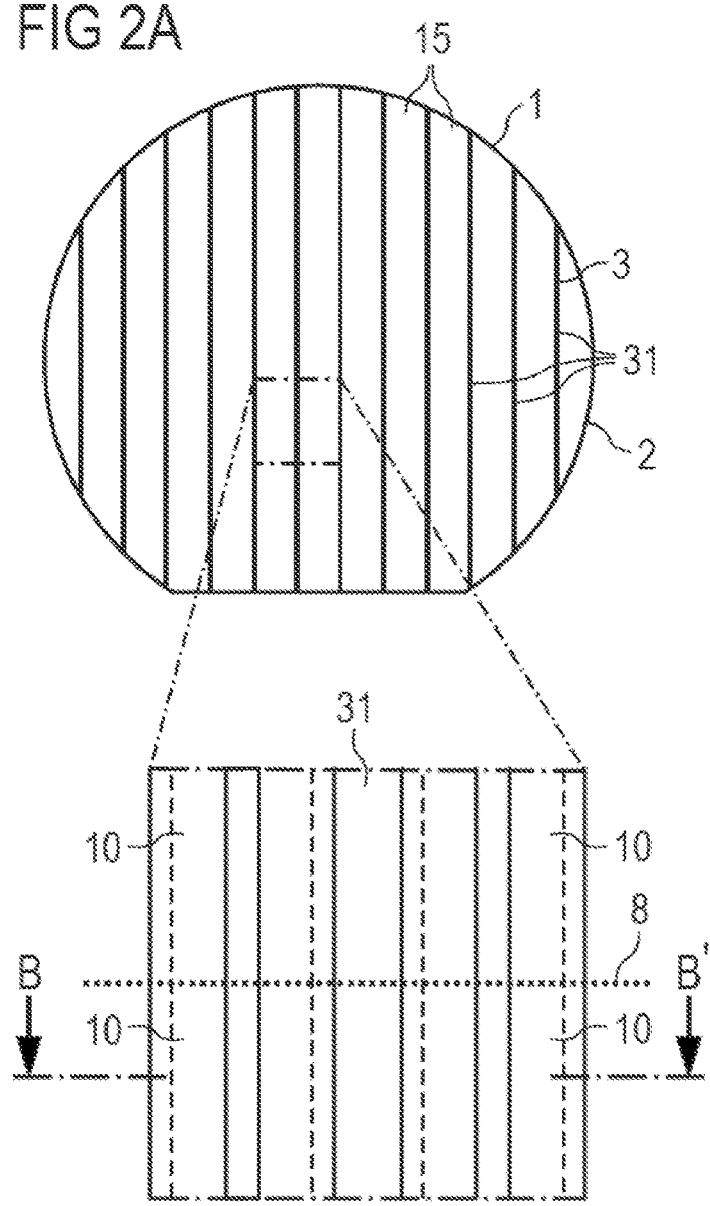
FIGS. 2A and 2B show a second exemplary embodiment of a component carrier assembly in schematic plan view (FIG. 2A) and associated sectional view (FIG. 2B)
Figure 2B:
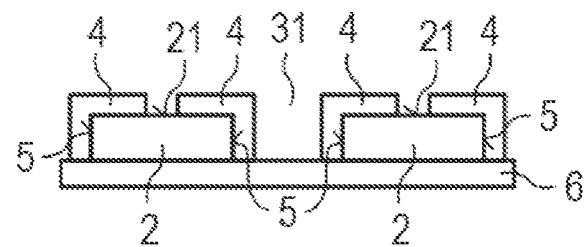

The second exemplary embodiment of a component carrier assembly, shown in FIGS. 2A and 2B, corresponds substantially to the first exemplary embodiment described in connection with FIGS. 1A and 1B. Unlike in the first embodiment, the component carrier assembly comprises strip-form regions 15, which are formed by means of the first trenches 31 of the trench pattern 3. The first trenches 31 extend in the first direction over the complete carrier body 2, such that the strip-form regions, each with a plurality of component carrier regions 10, are separated from one another.

The strip-form regions 15 are arranged on a common auxiliary carrier 6. An example of a suitable material for the auxiliary carrier 6 is a film, in particular a self-adhesive film. As described in connection with the first exemplary embodiment, the component carrier regions 10 on the strip-form regions 15 may be singulated along singulation lines 8 before or after mounting semiconductor components.

Figure 3A:
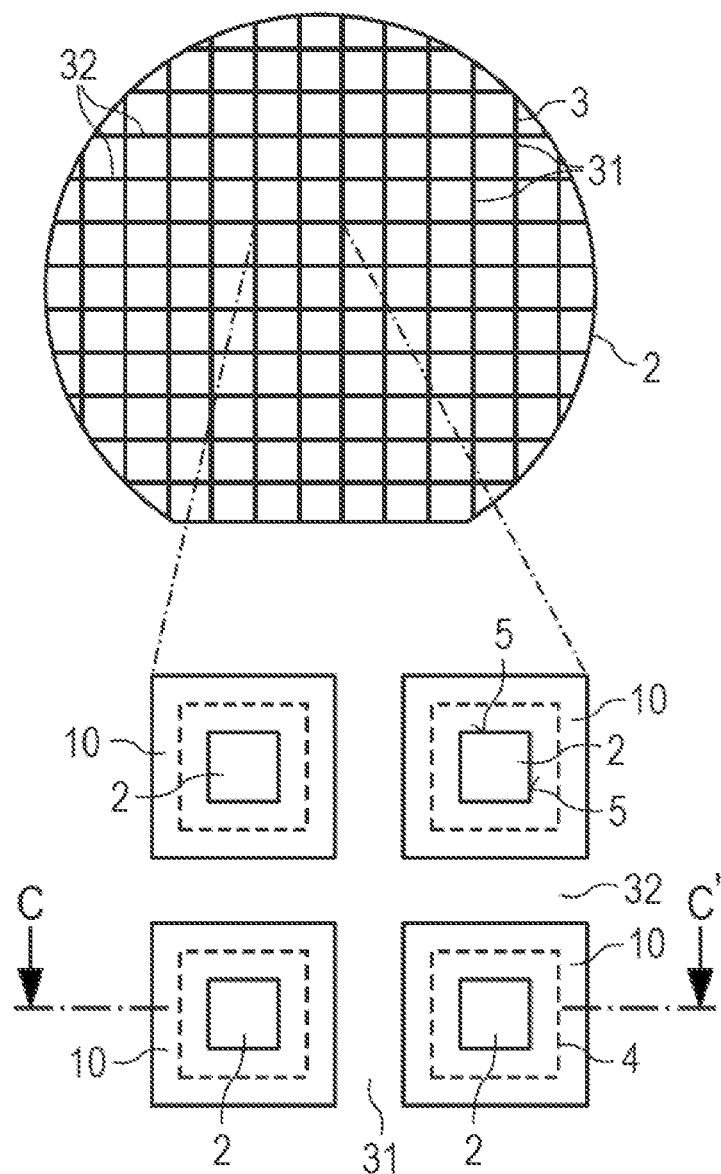
FIGS. 3A and 3B show a third exemplary embodiment of a component carrier assembly in schematic plan view (FIG. 3A) and associated sectional view (FIG. 3B)
Figure 3B:
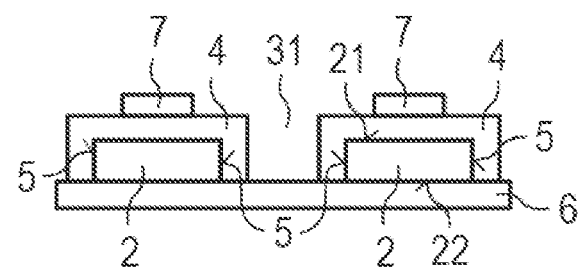

The third exemplary embodiment of a component carrier assembly, shown in FIGS. 3A and 3B, corresponds substantially to the second exemplary embodiment described in connection with FIGS. 2A and 2B. Unlike in the second embodiment, the trench pattern 3 comprises second trenches 32 extending in the second direction.

The carrier bodies 2 of the individual component carrier regions 10 are thus completely separated from one another by the trench pattern 3 and are available on the auxiliary carrier 6 for further processing, for example population with semiconductor components. By means of the auxiliary carrier 6, the component carrier regions 10 are arranged next to one another in a regular pattern, for example in a matrix. In comparison to component carriers which are provided as goods in bulk, population with semiconductor components, for example using a pick-and-place method, is simplified.

In this exemplary embodiment, the side faces 5 of the individual carrier bodies 2 of the component carrier regions 10 are provided with a coating 4 on all sides. As described in connection with the previous Figures, the coating 4 may however also be formed on just one side face or on two side faces.

A further coating 7 is formed on the side of the coating 4 remote from the carrier body 2. The further coating 7 may take the form, for example, of a solder layer. The further coating 7 may contain gold, indium, tin or silver, for example. A metal alloy with at least one of the stated materials, for example a gold-tin alloy, may also be used.

One exemplary embodiment of a method for producing a plurality of component carrier regions is shown in FIGS. 4A to 4F using intermediate steps each illustrated schematically in sectional view. In plan view the component carrier assembly may be embodied as described in connection with FIGS. 1A to 3B.

Figure 4A:
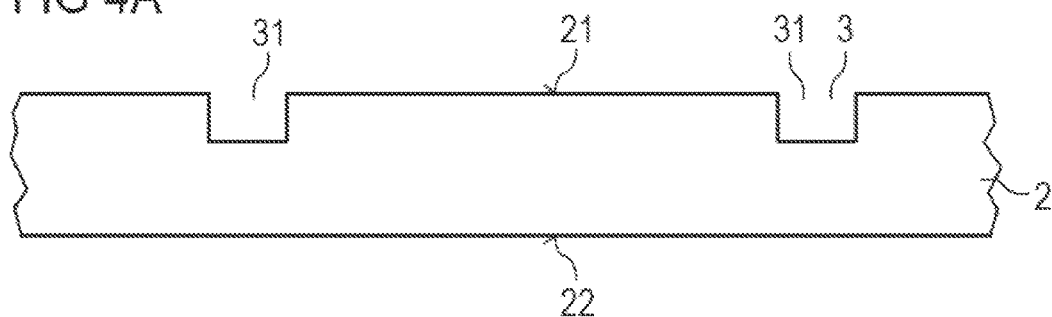
FIGS. 4A to 4F show an exemplary embodiment of a method for producing component carrier regions using intermediate steps each shown schematically in sectional view.

A carrier body 2 is provided which extends in a vertical direction between a first major face 21 and a second major face 22 (FIG. 4A). A trench pattern 3 comprising a plurality of first trenches 31 is formed on the first major face 21. The first trenches 31 extend in a vertical direction incompletely through the carrier body 2.

The trench pattern is preferably formed chemically, in particular dry chemically, for instance by means of deep reactive ion etching or by means of ASE. In contrast thereto, an erosion method may also be used.

Figure 4B:
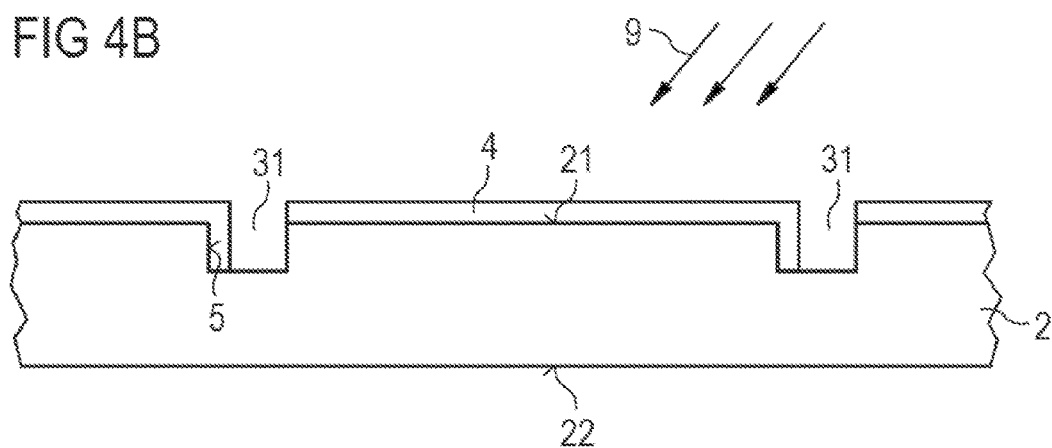

As shown in FIG. 4B, a coating 4 is formed by means of a coating source. The arrows 9 show a main coating direction of the coating source. The main coating direction is oblique to a normal to the first major face 21. Coating of side faces 5 of the trench pattern 3 is thus simplified. A sputtering method or vapour deposition, for example, may be used for coating.

Unlike in the described exemplary embodiment, the coating 4 may be patterned, for example by means of a photolithographic method.

Figure 4C:
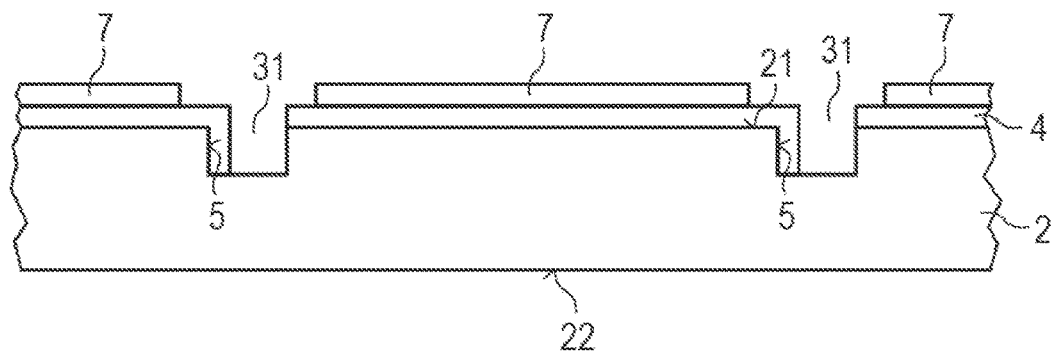

As shown in FIG. 4C, a further coating 7 may be applied to the coating 4. The further coating 7 may be applied using a method described in connection with the coating 4. Alternatively, the further coating may also be applied by means of a screen printing process. Patterned application of the further coating may thus be achieved simply and inexpensively.

Figure 4D:
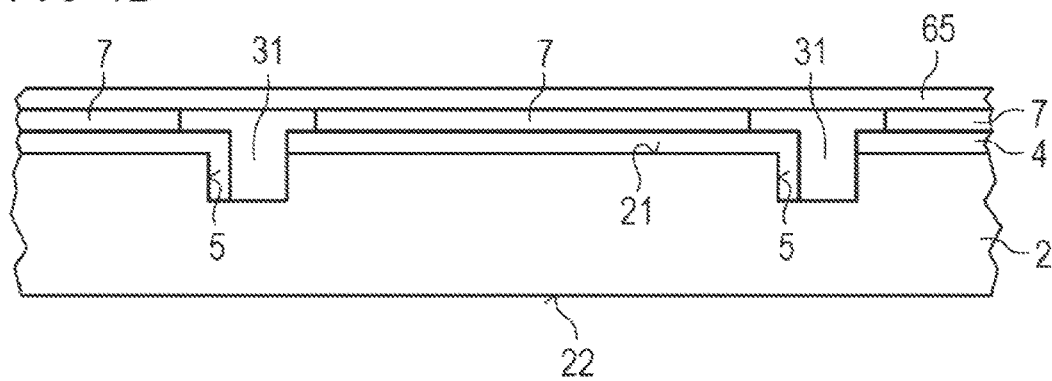
Figure 4E:
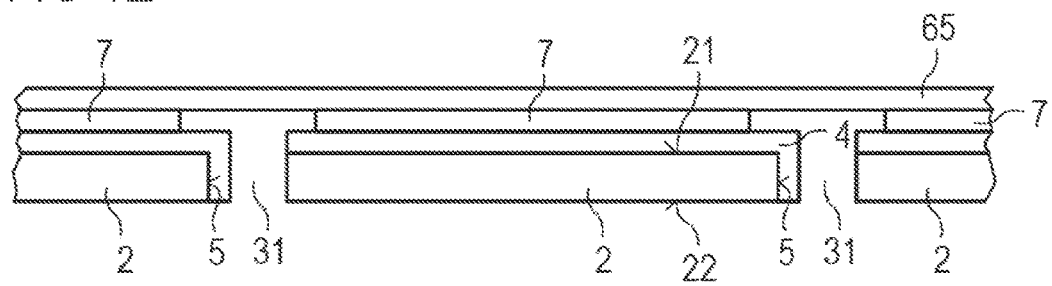
Figure 4F:
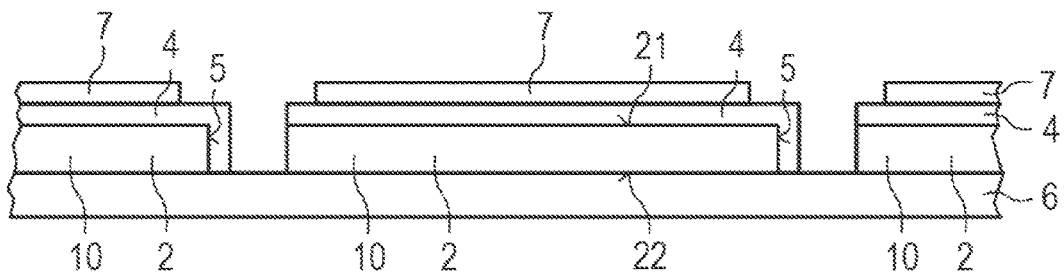

The carrier body 2 is mounted on a temporary carrier 65 on the first major face 21 side (FIG. 4D). A film, for example, is suitable for the temporary carrier 65. Alternatively, a rigid carrier may also be used.

From the second major face 22, the carrier body 2 is thinned at least until the trench pattern 3 extends completely through the carrier body in the vertical direction (FIG. 4E) Thinning may for example proceed mechanically, for instance by means of grinding, lapping or polishing. Then an auxiliary carrier 6 may be applied on the second major face 22 side. The temporary carrier 65 may then be detached.

In a configuration of the trench pattern as described in connection with FIGS. 1A and 1B, the carrier body 2 is continuous even after thinning, such that the auxiliary carrier 6 may be dispensed with.

Figure 5A:
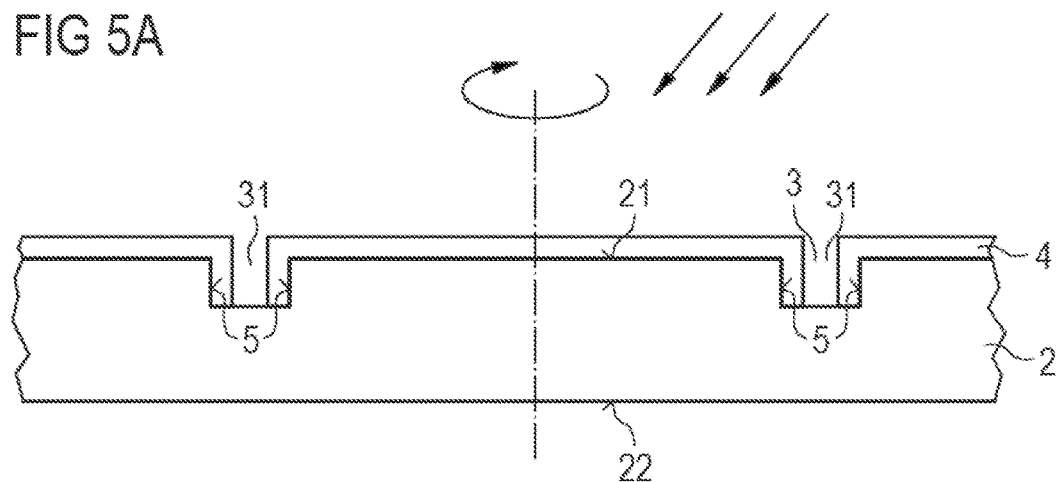
FIGS. 5A to 5B show a second exemplary embodiment of a method for producing component carrier regions using intermediate steps shown schematically in sectional view.

The second exemplary embodiment, shown in FIGS. 5A and 5B, of a method corresponds substantially to the first exemplary embodiment described in connection with FIGS. 4A to 4F. Unlike in said first embodiment, the carrier body 2 is rotated relative to its normal line during coating, such that the coating 4 may cover all the side faces 5 of the trench pattern 3.

Figure 5B:
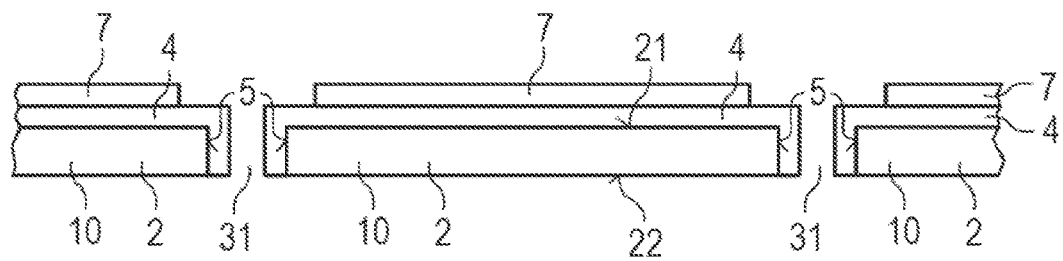

The finished component carrier regions 10 are shown in FIG. 5B.

The described method also provides a simple, reliable way of producing component carriers in which at least one side face arises as early as during formation of the trench pattern. Component carriers produced in this way may be distinguished by particularly high side face precision relative to the first major face. In particular, an angle of inclination of the side face may be established as early as during formation of the trench pattern. The angle of inclination to the first major face 21 is preferably 90° with a deviation of at most +/−5°. Depending on the requirements made of the component carriers to be produced, an angle other than 90°, in particular an angle between 10° and 85° inclusive, for example 45°, may also be convenient, however.

In addition, the component carrier regions 10 may be simply provided in a component carrier assembly, such that population with semiconductor components and additionally also start-up of the semiconductor components in the assembly may be performed simply.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:

1. A component carrier assembly comprising:
a plurality of component carrier regions, which are intended for mounting semiconductor components, wherein:
   the component carrier assembly comprises a carrier body with a first major face and a second major face opposite the first major face,
   on the first major face a trench pattern is formed in the carrier body, with first trenches extending in a first direction, the first trenches delimiting the component carrier regions in a second direction extended transversely of the trenches,
   a coating is formed on the carrier body, such that the component carrier regions each have a first major face of the carrier body which is coated at least in places and a side face of the trench pattern which is coated at least in places,
   the carrier body is based on a semiconductor material,
   the first trenches do not extend to an edge of the carrier body, the carrier body being of continuous construction,
   the second major face of the carrier body is free of material of the coating, and
   the carrier body is formed as a single and contiguous piece.

2. The component carrier assembly according to claim 1, wherein at least two side faces of a component carrier region are coated.

3. The component carrier assembly according to claim 1, wherein component carrier regions arranged adjacent one another in the second direction are separated from one another in the continuous carrier body by one of the first trenches.

4. The component carrier assembly according to claim 1, wherein the trench pattern comprises second trenches extending parallel to one another in the second direction, the second trenches delimiting the component carrier regions in the first direction.

5. A method for producing a plurality of component carrier regions, comprising the steps of:
   a) providing a component carrier comprising a carrier body having a first major face and a second major face opposite the first major face;
   b) forming a trench pattern in the carrier body in the first major face, wherein the trench pattern comprises first trenches extending in a first direction, which first trenches separate from one another at least in places the component carrier regions arranged adjacent one another in a second direction extending transversely of the first direction;
   c) forming a coating, which covers the first major face at least in places and a side face of the trench pattern at least in places; and
   d) thinning the carrier body at the second major face in such a way that the trench pattern extends completely through the carrier body at least in places in a direction extending obliquely or perpendicularly to the first major face,
wherein:
   the first trenches do not extend to an edge of the carrier body,
   the component carrier comprises a continuous carrier body forming a plurality of component carrier regions,
   the thinning of the carrier body in step d) is performed after step b), and is performed over the entire area of the second major face of the carrier body.

6. The method according to claim 5, wherein the coating in step c) is formed by means of a coating source and a main coating direction of the coating source is oblique to a normal to the first major face.

7. The method according to claim 6, wherein the carrier body is thinned in step d) over its entire area.

8. The method according to claim 5, wherein the trench pattern is formed using a dry chemical method or using erosion.

9. The method according to claim 5, wherein components are mounted on the component carrier, the components being operated prior to singulation.

10. The method according to claim 5, wherein the carrier body is thinned in step d) mechanically.

11. The method according to claim 5, wherein the carrier body is thinned by grinding, lapping or polishing.

12. A component carrier assembly comprising a plurality of component carrier regions, which are intended for mounting semiconductor components, wherein:
   the component carrier assembly comprises a carrier body with a first major face and a second major face opposite the first major face,
   on the first major face a trench pattern is formed in the carrier body, with first trenches extending in a first direction, the first trenches delimiting the component carrier regions in a second direction extended transversely of the trenches,
   a coating is formed on the carrier body, such that the component carrier regions each have a first major face of the carrier body which is coated at least in places and a side face of the trench pattern which is coated at least in places,
   the carrier body is based on a semiconductor material,
   the first trenches do not extend to an edge of the carrier body, the carrier body being of continuous construction, and
   the second major face of the carrier body is free of material of the coating,
   the carrier body is formed as a single and contiguous piece, and
   the first trenches extend completely through the carrier body in a direction that extends vertically to the first major face.

* * * * *